(12) United States Patent
Usami

(10) Patent No.: US 9,472,760 B2
(45) Date of Patent: Oct. 18, 2016

(54) PROCESS FOR FORMING ORGANIC SEMICONDUCTOR FILM

(71) Applicant: FUJIFILM Corporation, Tokyo (JP)

(72) Inventor: Yoshihisa Usami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/842,445

(22) Filed: Sep. 1, 2015

(65) Prior Publication Data

US 2015/0372233 A1  Dec. 24, 2015

Related U.S. Application Data

(63) Continuation of application No. PCT/JP2014/053930, filed on Feb. 19, 2014.

(30) Foreign Application Priority Data

Mar. 15, 2013  (JP) .................................. 2013-054250

(51) Int. Cl.
*H01L 51/40* (2006.01)
*H01L 51/00* (2006.01)
(Continued)

(52) U.S. Cl.
CPC ....... *H01L 51/0012* (2013.01); *H01L 51/0002* (2013.01); *H01L 51/0007* (2013.01); *H01L 51/0014* (2013.01); *H01L 51/00* (2013.01);
(Continued)

(58) Field of Classification Search
CPC .......... H01L 51/0002; H01L 51/0003; H01L 51/107; H01L 51/448; H01L 51/00; H01L 51/0007; H01L 51/0012; H01L 51/0014; H01L 51/0558; H01L 51/56
USPC ......................................................... 438/99
See application file for complete search history.

(56) References Cited

U.S. PATENT DOCUMENTS

2009/0194763 A1    8/2009  Mino et al.
2012/0129296 A1*   5/2012  Rolin ................ C23C 16/45565
                                                              438/99
2012/0193618 A1*   8/2012  Takeya ................ H01L 51/0004
                                                              257/40
(Continued)

FOREIGN PATENT DOCUMENTS

JP      2011-181698 A      9/2011
WO      2007/125950 A1    11/2007
(Continued)

OTHER PUBLICATIONS

Notification of Transmittal of Translation of the International Preliminary Report on Patentability (Chapter I) and Translation of Written Opinion of the International Searching Authority; PCT/JP2014/053930; issued on Sep. 24, 2015.
(Continued)

*Primary Examiner* — Thanh T Nguyen
(74) *Attorney, Agent, or Firm* — Studebaker & Brackett PC

(57) ABSTRACT

In the present invention, an organic semiconductor film is formed by using a cover member which is disposed on a substrate for forming the organic semiconductor film and forms a space relative to the substrate, filling the space between the cover member and the substrate with a solution, and drying the filled solution, wherein the cover member has a control surface on which an uppermost part most separated from the substrate and a descending part provided on both sides in the y-direction of the uppermost part so as to descend from the uppermost part toward the substrate are formed.

9 Claims, 5 Drawing Sheets

(51) Int. Cl.
*H01L 51/56* (2006.01)
*H01L 51/05* (2006.01)

(52) U.S. Cl.
CPC .......... *H01L51/003* (2013.01); *H01L 51/0558* (2013.01); *H01L 51/56* (2013.01)

(56) References Cited

U.S. PATENT DOCUMENTS

| | | | | |
|---|---|---|---|---|
| 2013/0143357 A1* | 6/2013 | Goto | ................... | H01L 51/0026 438/99 |
| 2014/0206135 A1* | 7/2014 | Maeda | ................... | H01L 51/052 438/99 |
| 2015/0014627 A1* | 1/2015 | Yu | ..................... | H01L 27/14665 257/13 |

FOREIGN PATENT DOCUMENTS

| | | |
|---|---|---|
| WO | 2007/142238 A1 | 12/2007 |
| WO | 2011/040155 A1 | 4/2011 |
| WO | 2012/026333 A1 | 3/2012 |
| WO | 2013/024678 A1 | 2/2013 |

OTHER PUBLICATIONS

The extended European search report issued by the European Patent Office on Mar. 1, 2016, which corresponds to European Patent Application No. 14764302.7-1555 and is related to U.S. Appl. No. 14/842,445.

An Office Action "Notification of Reasons for Refusal" issued by the Japanese Patent Office on Jul. 12, 2016, which corresponds to Japanese Patent Application No. 2013-054250 and is related to U.S. Appl. No. 14/842,445; with English language translation.

K. Nakayama et al, "Patternable Solution-Crystallized Organic Transistors with High Charge Carrier Mobility", Advanced Materials, 2011, p. 1626-1629, vol. 23, Wiley-VCH Verlag GmbH & Co. KGaA, Weimheim, DE.

International Search Report from PCT/JP2014/053930 dated Apr. 8, 2014.

\* cited by examiner

PROCESS FOR FORMING ORGANIC SEMICONDUCTOR FILM

CROSS-REFERENCE TO RELATED APPLICATIONS

This application is a Continuation of PCT International Application No. PCT/JP2014/053930 filed on Feb. 19, 2014, which claims priority under 35 U.S.C. §119(a) to Japanese Patent Application No. 2013-054250 filed on Mar. 15, 2013. The above application is hereby expressly incorporated by reference, in its entirety, into the present application.

BACKGROUND OF THE INVENTION

The present invention relates to a method for forming an organic semiconductor film used in thin film transistors or the like using organic semiconductor materials.

Organic semiconductor elements having organic semiconductor films (organic semiconductor layers) including organic semiconductor materials are used in devices using logical circuits such as thin film transistors (TFTs), RF tags (RFIDs), or memory used in liquid crystal displays or organic EL displays due to their ability to reduce weight, lower cost, and enhance flexibility.

In the production of an organic semiconductor element, one known method of forming an organic semiconductor film is a wet process of forming an organic semiconductor film by applying a coating prepared by dissolving an organic semiconductor material in a solvent to a substrate and then drying the solution.

This method for forming a wet organic semiconductor film has various advantages in that an organic semiconductor film can be formed inexpensively and that an organic semiconductor film can be formed in accordance with a large area.

Incidentally, in order to obtain an organic semiconductor film with high mobility, it is important to enhance the crystallinity of the organic semiconductor film. Therefore, various methods of improving the crystallinity of an organic semiconductor film have also been proposed in such a method of forming the wet organic semiconductor film.

For example, WO 2007/142238 describes a method of forming organic semiconductor crystals by forming a frame so as to enclose the formation position of an organic semiconductor film on a substrate, filling the frame with a solution in which an organic semiconductor material is dissolved, and then drying the solution.

In addition, WO 2011/040155 describes a method of forming a crystalline organic semiconductor film by using a contact member having a contact surface to which a solution in which an organic semiconductor material is dissolved is adhered, arranging the contact member so that the contact surface has a specific relationship with respect to the surface of the substrate, and then holding and drying the solution on the contact surface of the contact member.

Specifically, a method of forming a crystalline organic semiconductor film by using a contact member having a contact surface erected vertically on a substrate, filling a corner part formed by the contact surface and the substrate with a solution, and then drying the solution is described. In addition, a method of forming a crystalline organic semiconductor film by using a contact member having a contact surface which slopes with respect to a substrate, arranging the contact surface and the substrate so as to be separated by a prescribed spacing, filling the space between the contact surface and the substrate with a solution in contact with both the contact surface and the substrate, and then drying the solution is described as another method.

SUMMARY OF THE INVENTION

With these methods, it is possible to form an organic semiconductor film having crystallinity.

However, the demand for the formation of organic semiconductor films has become even more intense in recent years, and there is a demand for the emergence of a method capable of stably forming an organic semiconductor film which has better crystallinity and with which a semiconductor element with high mobility can be obtained.

An object of the present invention is to solve the problems of such conventional technology and to provide a method for forming an organic semiconductor film capable of stably forming an organic semiconductor film having good crystallinity and high mobility.

In order to achieve the above object, there is provided a method for forming an organic semiconductor film in which, when a solution in which an organic semiconductor material is dissolved is used so as to form an organic semiconductor film including the organic semiconductor material;

the organic semiconductor film is formed by using a cover member which is disposed on a substrate for forming the organic semiconductor film and forms a space relative to the substrate, filling the space between the cover member and the substrate with the solution, and drying the filled solution;

wherein the cover member has a control surface on which an uppermost part most separated from the substrate and a descending part provided on both sides in the y-direction of the uppermost part so as to descend from the uppermost part toward the substrate are formed; the cover member has a shape that opens in the x-direction orthogonal to the y-direction of the space where the control surface is formed; and the cover member is disposed in a state in which the entire area of at least one end part in the y-direction makes contact with the substrate with the control surface facing the substrate;

when an end part in the y-direction where the entire area of the cover member makes contact with the substrate is used as a base end, at least a part of the solution at the end part in the y-direction on the opposite side from the base end on the control surface is positioned at a location not surpassing the uppermost part of the control surface when viewed from the base end; and an apparent angle, which is an angle formed by (i) the shortest line connecting the base end and a separation position serving as a position where the solution is most separated from the base end in the y-direction on the control surface and (ii) the shortest line connecting the base end and a point where a perpendicular line dropped from the separation position onto the substrate intersects with the substrate, is at most 50°; and the base end side of the space between the cover member and the substrate is filled with the solution so that a ratio x/y determined by dividing the length in the x-direction by the length in the y-direction is at least 0.2.

In the method for forming an organic semiconductor film according to the present invention, it is preferred that the surface area of a portion where the solution does not make contact with the substrate and the cover member is preferably at most 35% of the surface area of the entire solution.

Preferably, the surface area of a portion where the solution does not make contact with the substrate and the cover member is preferably at least 1% of the surface area of the entire solution.

Preferably, the apparent angle is preferably at least 3°.

Preferably, the ratio x/y is preferably at most 100,000.

Preferably, the cover member is preferably disposed so that both end parts in the y-direction make contact with the substrate.

Preferably, the cover member is preferably disposed so that the entire area of both end parts in the y-direction makes contact with the substrate.

Preferably, the cover member preferably has a tabular shape.

Moreover, the cover member preferably has an area parallel to both end parts in the y-direction.

According to the present invention, in the formation of an organic semiconductor film using a solution in which an organic semiconductor material is dissolved, it is possible to stably form an organic semiconductor film with good crystallinity by properly controlling the evaporation of a solvent.

DETAILED DESCRIPTION OF THE INVENTION

Figure 1:
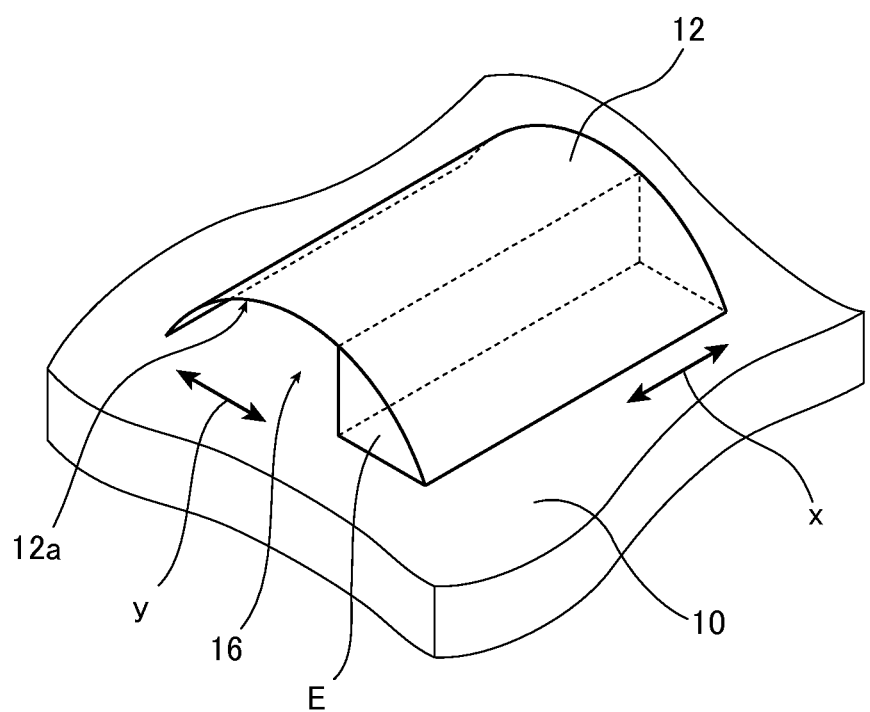
FIG. 1 is a perspective view conceptually illustrating an example of the method for forming an organic semiconductor film of the present invention.
Figure 2A:
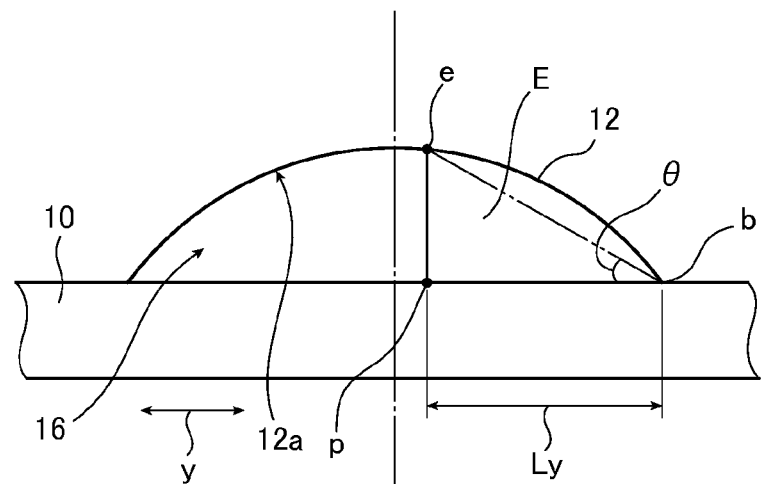
FIG. 2A is a front view of the method for forming an organic semiconductor film illustrated in FIG. 1.
Figure 2B:
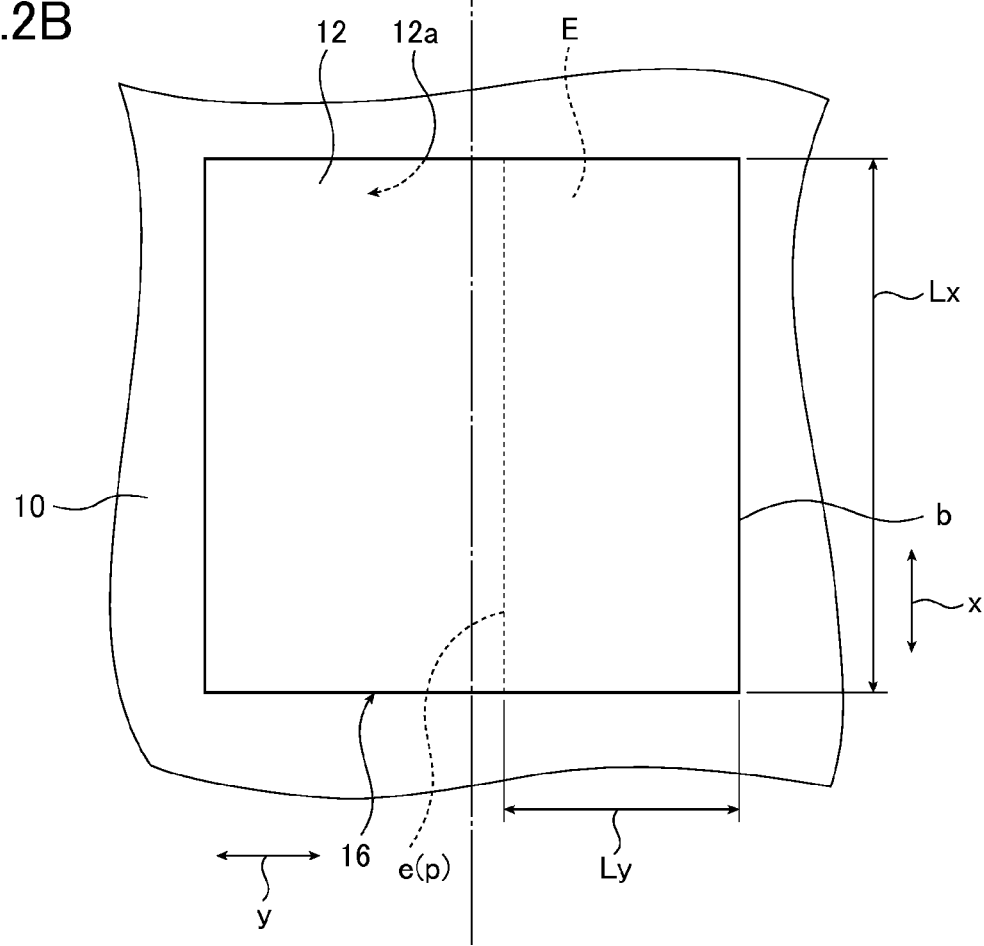
FIG. 2B is a plan view of the method for forming an organic semiconductor film illustrated in FIG. 1.

An example of the method for forming an organic semiconductor film of the present invention is illustrated conceptually in FIG. 1, FIG. 2A and FIG. 2B.

FIG. 2A is a front view when FIG. 1 is viewed from the direction of arrow x, and FIG. 2B is a plan view when FIG. 1 is viewed from above.

The method for forming an organic semiconductor film of the present invention (also simply called the "formation method of the present invention" hereafter) forms an organic semiconductor film using a solution prepared by dissolving an organic semiconductor material serving as an organic semiconductor film in a solvent.

As illustrated conceptually in FIG. 1, FIG. 2A and FIG. 2B, in the method for forming an organic semiconductor film of the present invention, an organic semiconductor film is formed by disposing a cover member 12 forming a space 16 relative to a substrate 10 on the substrate 10 for forming an organic semiconductor film, filling this space 16 with a solution (described as "coating solution E" hereafter) prepared by dissolving an organic semiconductor material serving as an organic semiconductor film in a solvent so as to make contact with the substrate 10 and the cover member 12, drying the coating solution E, and then removing the cover member 12.

In the formation method of the present invention, an organic semiconductor film is formed on the surface of the substrate 10. That is, the substrate 10 is a substrate or the like of an organic semiconductor element.

Tabular substances (sheet-shaped substances/films) made of various materials such as metals including silicon, ceramic, glass, or plastic can be used as the substrate 10 as long as an organic semiconductor film in which an organic semiconductor material is dissolved can be formed.

In addition, substances of various constitutions can be used as the substrate for forming an organic semiconductor film in the production of an organic semiconductor element in addition to the simple tabular substances of the illustrated examples.

For example, the substrate may be a substance in which an insulating layer is formed on all or part of the surface of a supporting member (substrate of a semiconductor element), a substance in which a gate electrode is formed on a supporting member and the supporting member and gate electrode are covered to form an insulating layer, or a substance in which an insulating layer is formed on the surface of a supporting member serving as a gate electrode and a source electrode and a drain electrode are formed thereon.

That is, the method for forming an organic semiconductor film of the present invention can be used to form an organic semiconductor film (organic semiconductor layer) in the production process of various known organic semiconductor elements such as bottom gate/bottom contact type, top gate/bottom contact type, bottom gate/top contact type, and top gate/bottom contact type.

The various substances illustrated as examples of the substrate 10 described above can be used as the supporting members of these substrates.

The cover member 12 forms a space to be filled with a coating solution E serving as an organic semiconductor film between the surface of the substrate 10 on which the organic semiconductor film is formed (also called the "surface" hereafter) (that is, the cover member 12 regulates the coating region of the coating solution E) and controls the drying of the coating solution E (evaporation of the solvent).

In the formation method of the present invention, the cover member has a control surface having an uppermost part separated most from the surface of the substrate 10 and a descending part provided on both sides of the uppermost part in the direction of arrow y so as to descend toward the surface of the substrate 10 from the uppermost part, and this control surface is disposed facing the substrate 10. In addition, the space formed by the control surface of the cover member together with the surface of the substrate 10 is open in the x-direction orthogonal to the y-direction.

In the example illustrated in FIG. 1, FIG. 2A and FIG. 2B, the cover member 12 has a shape formed by bending a square plate material (sheet-shaped substance/film) into an arc shape (peripheral surface shape of a cylinder).

In this cover member 12, the concave surface of the arc forms a control surface 12a. The cover member 12 is mounted on the surface of the substrate 10 so that the concave surface of the control surface 12a faces the substrate 10 using the circumferential direction of the arc (direction orthogonal to the center line) as the y-direction. Accordingly, the x-direction orthogonal to the y-direction becomes parallel to the center line of this arc (in FIG. 2A, the x-direction is the direction orthogonal to the page).

In addition, this cover member 12 is disposed so that the entire area on both ends in the y-direction makes contact with the surface of the substrate 10.

In the illustrated example, the position indicated by the alternate long and short dash line in FIG. 2A and FIG. 2B is the uppermost part of the cover member 12 (uppermost part of the arc).

Accordingly, the control surface 12a of the cover member 12 is configured so as to have a descending part facing both sides in the y-direction from the uppermost part indicated by the alternate long and short dash line so as to descend toward the surface of the substrate 10 in an arc shape.

In the formation method of the present invention, an end part in the y-direction, the entire area of which makes contact with the surface of the substrate 10, is used as a base end, and this base end side is filled with the coating solution E.

As described above, the entire surfaces of both end parts in the y-direction of the control surface 12a of the cover member 12 of the illustrated example are brought into contact with the substrate 10. Therefore, this cover member 12 may use either end part in the y-direction as a base end. In the illustrated example, the right side is defined as the base end b, for example.

In the formation method of the present invention, an organic semiconductor film is formed by filling the base end b side of the space 16 formed by such a cover member 12 and the substrate 10 with the coating solution E so as to make contact with the cover member 12 and the substrate 10 and then drying the coating solution E.

Here, the space 16 is filled with the coating solution E so that at least one part of the end part in the y-direction on the opposite side from the base end b on the control surface 12a does not surpass the uppermost part—that is, the alternate long and short dash line—when viewed from the base end b.

In addition, the space 16 is filled with the coating solution E so that the apparent angle θ, which is the angle formed by a line in the y-direction (alternate long and two short dashes line) connecting the base end b and a position e (also called the "separation position e" hereafter) where the coating solution E is most separated from the base end b in the y-direction on the control surface 12a and a line in the y-direction connecting the base end b and a point p where a perpendicular line dropped onto the substrate 10 from the separation position e intersects with the substrate 10, is at most 50°. In other words, the space 16 is filled with the coating solution E so that the vertical angle on the base end b side of a right triangle forming a plane parallel to the y-direction connecting the base end b, the separation position e, and the point p is at most 50°.

Further, the space 16 is filled with the coating solution E so that the ratio x/y determined by dividing the length Lx in the x-direction by the length Ly in the y-direction is at least 0.2.

In the method for forming an organic semiconductor film of the present invention, an organic semiconductor film is formed by using such a cover member 12 having a prescribed shape, filling the space 16 formed by the substrate 10 and the cover member 12 with the coating solution E so as to satisfy the three conditions described above, and then drying the coating solution E.

Since the present invention has such a configuration, it is possible to suitably adjust the drying rate of the coating solution E by increasing the solvent concentration in the evaporation space—that is, the space 16—of the coating solution E so as to reduce the evaporation rate—that is, the drying rate—of the solvent of the coating solution E and controlling the contact area between the coating solution E and outside air (that is, the evaporation area of the solvent).

Therefore, with the method for forming an organic semiconductor film of the present invention, it is possible to form a high-quality organic semiconductor having suitable crystallinity and crystal size and a low frequency of defects by properly controlling the drying of the coating solution E.

In FIG. 1, FIG. 2A and FIG. 2B, the liquid surface of the coating solution E with which the space 16 is filled is illustrated in a flat shape in order to simplify the drawings and explanations, but the liquid surface of the coating solution E with which the space 16 is filled does not necessarily have a flat shape and often has a shape such as a convex shape or a concave shape. For example, as illustrated conceptually in FIG. 3A and FIG. 3B, the liquid surface on the opposite side from the base end b in the y-direction may also have a convex shape. Alternatively, the liquid surface may also, conversely, have a concave shape.

Figure 3A:
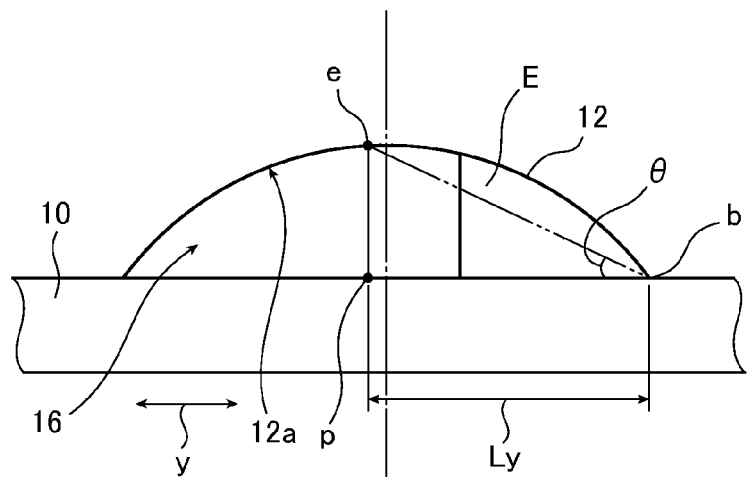
FIG. 3A is a front view of another example of the method for forming an organic semiconductor film of the present invention.
Figure 3B:
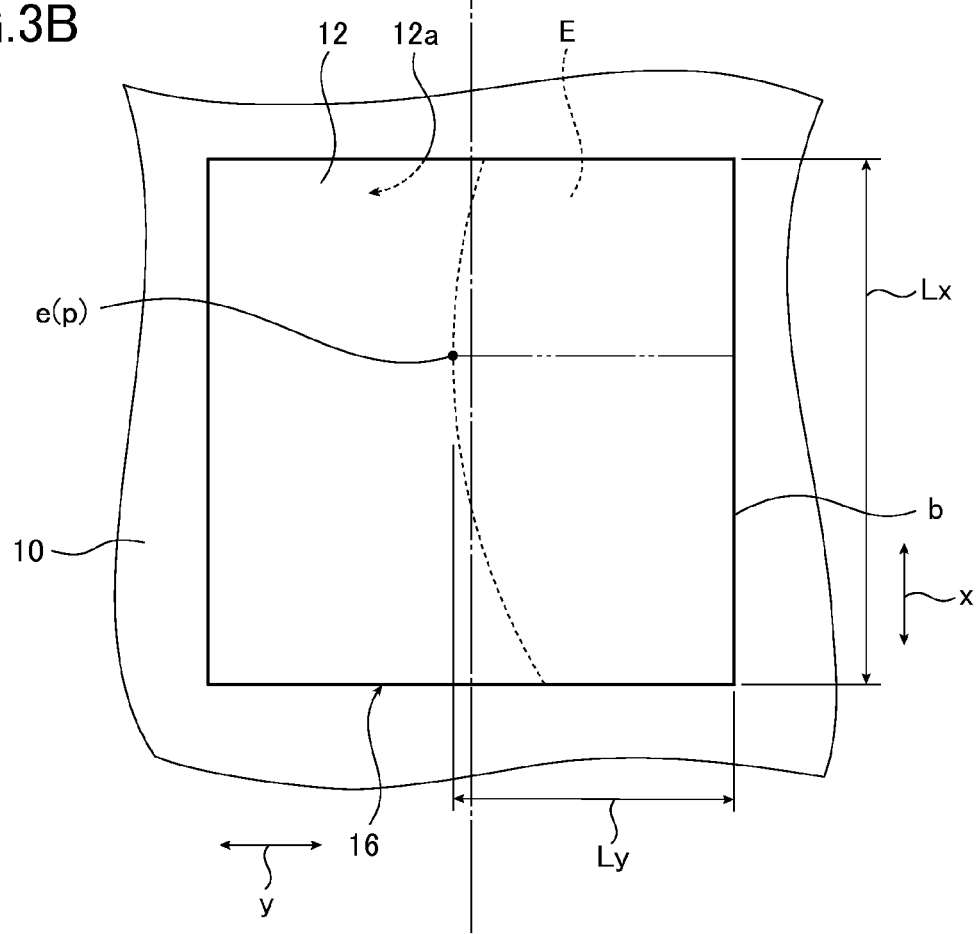
FIG. 3B is a plan view.

In this case, as illustrated in FIG. 3A and FIG. 3B, the position most separated from the base end b in the y-direction on the liquid surface on the opposite side from the base end b on the control surface 12a is defined as the separation position e.

In addition, as illustrated in FIG. 3A and FIG. 3B, in cases in which the liquid surface on the opposite side from the base end b in the y-direction is a convex shape or the like rather than a flat shape, on the control surface 12a, it is unnecessary for the entire coating solution E to be positioned closer to the base end b side than the uppermost part of the control surface 12a when viewed from the base end b side.

That is, in the present invention, as illustrated in FIG. 3A and FIG. 3B, there may be an area on the control surface 12a where a portion of the coating solution E surpasses the uppermost part in the y-direction when viewed from the base end b as long as it is positioned closer to the base end b side in the y-direction than the uppermost part (alternate long and short dash line) when viewed from the base end b.

As described above, the control surface 12a of the cover member 12 has an uppermost part separated most from the substrate 10 and a descending part which extends from the uppermost part in the y-direction and descends from the uppermost part toward the surface of the substrate 10 on both sides in the y-direction of the uppermost part. That is, the control surface 12a of the cover member 12 has an area which descends from the uppermost part toward the substrate 10 on the other side of the uppermost part when viewed in the y-direction from the base end b filled with the coating solution E.

The control surface 12a of such a cover member 12 forms, together with the substrate 10, a space 16 with a convex shape using the uppermost part as a vertex facing upward (opposite side from the substrate 10). Therefore, the solvent evaporated from the coating solution E remains inside this convex space 16, and as a result, it is possible to increase the solvent concentration inside the space 16 and to reduce the drying rate of the coating solution E.

Part of the end face in the x-direction of the space 16 formed by the substrate 10 and the cover member 12 may be opened, but it is preferable for the entire face to be opened, as in the illustrated example.

This makes it possible to further enhance the controllability of the drying of the coating solution E with the apparent angle θ, the ratio x/y, and the contact area ratio with the outside air described below.

In the formation method of the present invention, at least part of the coating solution E with which the space 16 is filled is applied so as not to surpass the uppermost part on the control surface 12a when viewed from the base end b.

When the coating solution E with which the space 16 is filled is applied so as to completely surpass the uppermost part on the control surface 12a when viewed from the base end b, the coating solution E flows to the end part on the opposite side from the base end b in the y-direction. Therefore, the coating solution E is applied at a different position from the base end b side of the space 16—that is, the location where the organic semiconductor film is to be formed—so the organic semiconductor film cannot be formed at the target position.

In addition, in the formation method of the present invention, the apparent angle θ formed by the line (alternate long and two short dashes line) connecting the base end b and the separation position e and the line connecting the base end b and the point p where a perpendicular line from the separation position e and the substrate 10 intersect is specifically the apparent angle of the coating solution E with which the space 16 is filled with respect to the base end b.

In the present invention, the space 16 is filled with the coating solution E so that this apparent angle θ is at most 50°. When the apparent angle θ exceeds 50°, the contact area between the coating solution E and outside air becomes too large, and the drying rate of the coating solution E becomes too fast, which causes the crystallinity of the organic semiconductor to decrease.

Taking this into consideration, the apparent angle is preferably at most 40°, more preferably at most 30°, and particularly preferably at most 20°.

Meanwhile, the apparent angle θ should be greater than 0°. However, the rate of drying of the coating solution decreases as the apparent angle θ becomes smaller, so the productivity decreases, and fine crystals tend to be generated on the organic semiconductor film that is formed.

Taking this into consideration, the apparent angle θ is preferably at least 3°, more preferably at least 5°, and particularly preferably at least 10°.

In the present invention, the space 16 is filled with the coating solution E so that the ratio x/y determined by dividing the length Lx in the x-direction of the coating solution by the length Ly in the y-direction is at least 0.2.

When the ratio x/y is less than 0.2, the contact area between the coating solution E and outside air becomes too large, and the drying rate of the coating solution E becomes too fast, which causes the crystallinity of the organic semiconductor to decrease.

Taking this into consideration, the ratio x/y is preferably at least 0.2, more preferably at least 0.3, and particularly preferably at least 0.45.

Meanwhile, taking into consideration cases in which multiple organic semiconductor elements are formed in accordance with the production of TFTs (thin film transistors) for a display or the like, the ratio x/y may be larger.

However, according to research conducted by the present inventors, the ratio x/y is preferably at most 100,000, more preferably at most 10,000, even more preferably at most 1,000, and particularly preferably at most 100.

As described above, when the liquid surface of the coating solution E is not flat, the length Ly of the coating solution E in the y-direction is determined to be the distance in the y-direction between the base end b and the coating solution E at a position most separated from the base end b in the y-direction on the substrate 10.

In addition, the length Lx in the x-direction of the coating solution E is determined to be the distance in the x-direction at a position where the liquid surface is most separated in the x-direction on the substrate 10.

In the method for forming an organic semiconductor film of the present invention, when the area where the coating solution E makes contact with the outside air is too large, the drying rate of the coating solution E becomes too fast, which may cause the crystallinity of the organic semiconductor to decrease.

Taking this into consideration, the surface area where the coating solution E makes contact with the outside air—that is, the surface area where the coating solution E does not make contact with the substrate 10 and the cover member 12—is preferably at most 35%, more preferably at most 32%, even more preferably at most 30%, and particularly preferably at most 20% of the surface area of the entire coating solution E.

Conversely, in the formation method of the present invention, the rate of drying of the coating solution decreases as the area where the coating solution E makes contact with the outside air becomes smaller, so the productivity decreases, and fine crystals tend to be generated on the organic semiconductor film that is formed.

Taking this into consideration, the surface area where the coating solution E makes contact with the outside air is preferably at least 1%, more preferably at least 5%, even more preferably at least 10%, and particularly preferably at least 15% of the surface area of the coating solution.

As described above, the liquid surface of the coating solution E does not necessarily have a flat shape and often has a concave shape or a convex shape, so it is very difficult to accurately calculate the surface area of the coating solution.

Therefore, in the present invention, the liquid surface on the opposite side from the base end b in the y-direction of the coating solution E is considered to have a flat shape parallel to the x-direction at a position where the base end b and the coating solution E are separated most in the y-direction. In addition, the liquid surface of the coating solution E on both sides in the x-direction is considered to be a right triangle with a flat surface parallel to the y-direction connecting the base end b, the separation position e, and the point p using the liquid surface in the y-direction set in this way. In the present invention, the apparent surface area of the coating solution E, which is calculated using the liquid surface set as described above, is defined as the surface area of the coating solution E.

In the method for forming an organic semiconductor film of the present invention, members of various shapes may be used as the cover member in addition to the arc shape of the illustrated example in which both ends in the y-direction of the control surface 12a make contact with the substrate 10, as long as a convex space such as that described above can be formed.

In addition, the cover member may be disposed on the substrate 10 in various states.

Figure 4A:
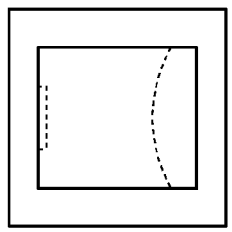
FIG. 4A to FIG. 4I schematically illustrate other examples of the method for forming an organic semiconductor film of the present invention.
Figure 4A:
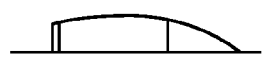
Figure 4B:
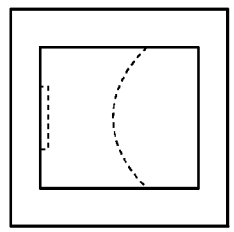
Figure 4B:
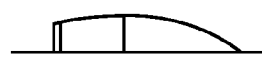

For example, as illustrated conceptually in FIG. 4A and FIG. 4B, one end in the y-direction of an arc-shaped cover member may be configured so that it does not make contact with the substrate 10. In FIG. 4A to FIG. 4I, the horizontal direction in the drawing is the y-direction in all of the examples.

In addition, at this time, the side of the cover member that does not make contact with the substrate 10 may be supported by a columnar member as necessary. Alternatively, the side of the cover member that does not make contact with the substrate 10 may be suspended and supported from above.

However, from the perspectives that the solvent concentration can be suitably increased in the evaporation space of the coating solution E and that the evaporation of the coating solution E can be controlled easily, it is preferable for both ends in the y-direction of the cover member to make contact with the substrate 10, and, in particular, it is more preferable for the entire area on both ends in the y-direction to make contact with the substrate 10, as illustrated in FIG. 1 and the like.

Figure 4C:
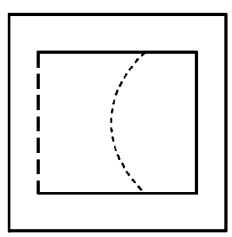
Figure 4C:
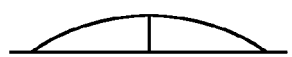

In addition, as illustrated conceptually in FIG. 4C, an arc-shaped cover member similar to FIG. 1, FIG. 2A and FIG. 2B may have a configuration in which the entire area of one end part in the y-direction makes contact with the substrate 10 and the other end part partially makes contact with the substrate 10 while a portion does not make contact with the substrate 10.

Figure 4D:
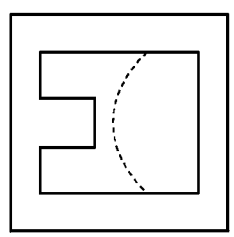
Figure 4D:
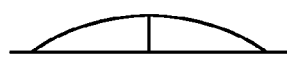

Alternatively, as illustrated conceptually in FIG. 4D, an arc-shaped cover member similar to FIG. 1, FIG. 2A and FIG. 2B may have a configuration in which the entire area of one end part in the y-direction makes contact with the substrate 10, while the other end part has a rectangular notch, and the end part excluding this notch makes contact with the substrate 10. This notch may have various shapes such as a triangular or circular shape in addition to a rectangular shape. Further, the notch may be formed at an end rather than in the center in the x-direction.

In addition, various shapes may be used for the flat shape of the cover member (shape of the plate material serving as the cover member) in addition to the square shape illustrated in the drawings.

Figure 4E:
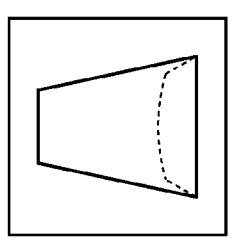
Figure 4E:
Figure 4F:
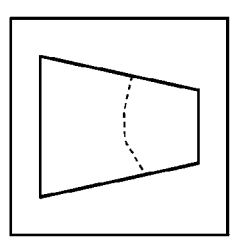
Figure 4F:

For example, as illustrated conceptually in FIG. 4E and FIG. 4F, the cover member may have a trapezoidal shape. When the cover member has an area parallel to both end parts in the y-direction, as in the case of the square illustrated in FIG. 1 or the like, this trapezoid, or a rectangle, both ends in the y-direction of the cover member can be easily brought into contact with the substrate 10, and the entire area of both ends in the y-direction can preferably be brought into contact with the substrate 10.

Further, as in the examples above, the cover member may have a shape not having a descending part which gradually approaches the substrate 10 from the uppermost part on both sides in the y-direction.

Figure 4G:
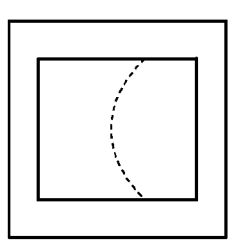
Figure 4G:

For example, as illustrated conceptually in FIG. 4G, a cover member of a shape in which the end parts of a rectangular parallelepiped are bent perpendicularly (that is, a regular hexahedron shape in which the one largest surface and the two opposing side surfaces are opened), the bent end parts are brought into contact with the substrate 10 using the bent sides as the y-direction. In this case, the uppermost part has a flat shape, and the portions bent perpendicularly become descending parts.

Figure 4H:
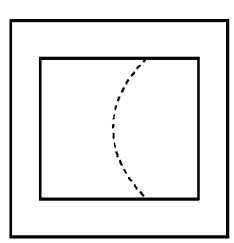
Figure 4H:
Figure 4I:
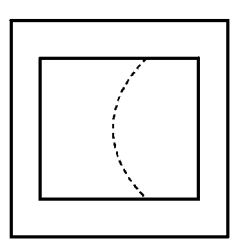
Figure 4I:

Alternatively, rather than having a flat shape such as that illustrated in FIG. 4G, the upper surface may have a portion which slopes in a triangular shape, as illustrated conceptually in FIG. 4H, or a portion which slopes toward the substrate 10 on the side of one of the descending parts, as illustrated conceptually in FIG. 4I.

Figure 5:
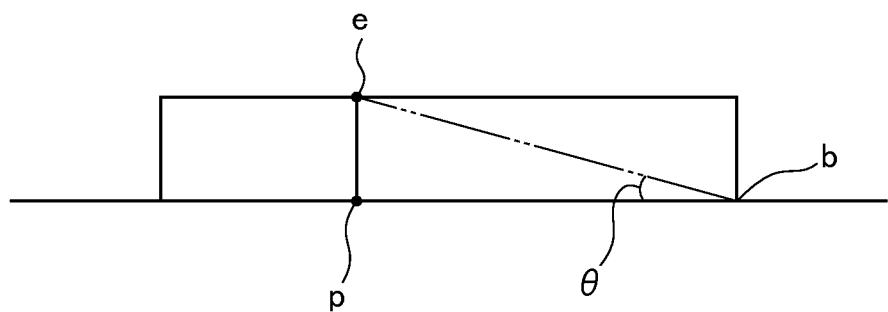
FIG. 5 is a conceptual diagram for explaining the method for forming an organic semiconductor film of the present invention.

In the formation method of the present invention, even in a configuration in which the cover member has a flat (linear) uppermost part, as illustrated in FIG. 4G to FIG. 4I, the aforementioned apparent angle θ is, as described above, defined as the angle formed by the line connecting the base end b and the separation position e most separated from the base end b in the y-direction on the control surface and the line connecting the base end b and the point p where a perpendicular line from the separation position e intersects with the substrate 10, as illustrated conceptually in FIG. 5.

Further, in the formation method of the present invention, the cover member is not limited to a tabular member such as that illustrated in the drawings, and members of various shapes may be used as long as a control surface for forming a convex space such as that described above is formed. For example, a concave part such as an arc columnar shape may be formed on one side of a block-shaped member such as a rectangular parallelepiped or a cube, and a space to be filled with a solution may be formed relative to the substrate 10 using this surface as a control surface.

In addition, in the formation method of the present invention, the cover member disposed on the surface of the substrate 10 is not limited to a single member, and an organic semiconductor film may be formed by disposing a plurality of cover members on the surface of a single substrate. Further, a single cover member may have a plurality of control surfaces corresponding to the shapes of a plurality of organic semiconductor films.

In the formation method of the present invention, the cover member 12 may be formed from various materials.

Specifically, liquid-repellent materials such as fluorene resins including polytetrafluoroethylene, polychlorotrifluoroethylene, trifluoride resins, polyvinylidene fluoride, polyvinyl fluoride, fluorinated resin copolymers, perfluoroalkoxy fluorine resins, ethylene tetrafluoride/propylene hexafluoride copolymers, ethylene/ethylene tetrafluoride copolymers, and ethylene/chlorotrifluoroethylene copolymers, and silicone resins are preferable.

Further, a material prepared by coating a surface of a resin or the like with a water-repellent resin or subjecting the surface to liquid-repellent treatment may also be preferably used as the cover member 12.

In addition, the size of the cover member 12 should be determined appropriately in accordance with the organic semiconductor film to be formed.

As described above, in the formation method of the present invention, an organic semiconductor film is formed on the surface of a substrate 10 by disposing a cover member 12 on the surface of the substrate 10, filling the base end b side of a space 16 formed by the surface of the substrate 10 and the cover member 12 with a coating solution E prepared by dissolving an organic semiconductor material serving as an organic semiconductor film, drying the coating solution E, and removing the cover member 12.

In addition, in the formation method of the present invention, the surface of the substrate 10 may be subjected to various types of surface treatment such as treatment to enhance the wettability of the substrate 10 including UV ray irradiation or ozone treatment as necessary before the cover member 12 is disposed on the substrate 10.

In the present invention, various known materials that are used in organic semiconductor films formed by so-called wet processes such as coating methods can be used as organic semiconductor materials in the production of an organic semiconductor element.

Specific examples include pentacenes such as 6,13-bis(triisopropylsilylethynyl)pentacene (TIPS pentacene), rubrenes, fullerenes, phthalocyanines, and TCNQ substances.

In addition, the present invention is not limited to these organic semiconductor materials, and low molecular-type organic semiconductor materials are preferably used.

Further, various solvents can be used as the solvent contained in the coating solution E as long as the organic semiconductor material that is used can be dissolved.

For example, when the organic semiconductor material is an acene such as TIPS pentacene, preferable examples include toluene, anisole, n-butyl benzene, and acetone.

In addition, the concentration of the organic semiconductor material in the coating solution E should be set appropriately in accordance with the type of the organic semiconductor material, the type of the solvent, the thickness of the organic semiconductor film to be formed, the shape of the cover member 12, and the like.

In the method for forming an organic semiconductor film of the present invention, the coating solution E may contain a surfactant, a polymer, or the like as necessary in addition to the organic semiconductor material and the solvent.

When the coating solution E contains components other than the organic semiconductor material and the solvent, the content thereof is preferably at most 50 mass %.

The method for forming an organic semiconductor film of the present invention was described in detail above, but the present invention is not limited to the examples described above, and various improvements or modifications may, as a matter of course, be made without departing from the scope of the present invention.

EXAMPLES

Specific working examples of the present invention will be given hereinafter to describe the method for forming an organic semiconductor film of the present invention in further detail.

Working Example 1

An n-type silicone substrate with an area of 20×20 mm and a thickness of 0.5 mm was prepared. The surface of this silicone substrate was heat-treated to form a thermal oxide film with a thickness of 300 nm, which was used as a substrate 10.

Further, the surface of the thermal oxide film was irradiated with UV rays to increase the wettability.

Meanwhile, a Teflon sheet with an area of 16×16 mm and a thickness of 0.2 mm was prepared.

This Teflon sheet was bent in one direction so as to form a cover member 12 with an arc shape (cylindrical peripheral surface shape) having a height of 1 mm, as illustrated in FIG. 1, FIG. 2A and FIG. 2B.

Further, TIPS pentacene was dissolved in toluene so as to prepare a coating solution E. The concentration of TIPS pentacene in the coating solution was set to 1 mass %.

As illustrated in FIG. 1, the cover member 12 was mounted on the substrate 10. Since the cover member 12 has an arc shape with a height of 1 mm, the height of the uppermost part of the cover member 12 is 1 mm.

Next, the base end b side of the space 16 was filled with the coating solution E using a syringe. The filling of the coating solution E was performed so that the position most separated from the base end b on the control surface 12a of the cover member 12 coincides with the uppermost part in the y-direction and so that it reaches the entire area of the cover member 12 in the x-direction. Accordingly, in this example, the coating solution E has a length Ly of 8 mm in the y-direction and a length Lx of 16 mm in the x-direction.

The length Ly in the y-direction and the length Lx in the x-direction of the coating solution E, the apparent angle θ [°], the surface area [mm$^2$] of the coating solution E, the contact area [mm$^2$] with the outside air and the percentage [%] of the area in contact with the outside air, and the ratio x/y in this state are shown in the table below.

The substrate 10 and the cover member 12 filled with the coating solution E in this way were dried for ten minutes in a draft chamber.

After drying, the substrate 10 was removed from the draft chamber, and the cover member 12 was removed to produce a substrate 10 having an organic semiconductor thin film formed on the surface.

Two metal electrodes having square patterns of 1 mm on each side were formed at a spacing of 50 μm by vacuum deposition on the organic semiconductor film (TIPS pentacene film) formed in this way, and an organic semiconductor element (organic thin film transistor) was thereby produced.

In the configuration of this organic semiconductor element, the silicon wafer acts as a gate electrode, the thermal oxide film acts as a gate insulating film, and the two metal electrodes respectively acts as a source electrode and a drain electrode.

Working Example 2 to Working Example 9

Organic semiconductor films were formed and organic semiconductor elements were produced in the same manner as in Working Example 1, respectively: with the exception that the height of the arc of the cover member 12 was set to 1.6 mm (Working Example 2);

with the exception that the length in the x-direction of the Teflon sheet serving as the cover member 12 was set to 8 mm (Working Example 3);

with the exception that the length in the x-direction of the Teflon sheet serving as the cover member 12 was set to 4 mm (Working Example 4);

with the exception that the length in the y-direction of the Teflon sheet serving as the cover member 12 was set to 32 mm (that is, the length Ly of the coating solution was 16 mm) (Working Example 5);

with the exception that the height of the arc of the cover member was set to 2.5 mm (Working Example 6);

with the exception that the height of the arc of the cover member was set to 5 mm (Working Example 7);

with the exception that the length in the x-direction of the Teflon sheet serving as the cover member 12 was set to 64 mm (Working Example 8); and with the exception that the length in the x-direction of the Teflon sheet serving as the cover member 12 was set to 160 mm (Working Example 9).

In examples in which the Teflon sheet serving as the cover member 12 was greater than the substrate 10, a large n-type silicone substrate was used, and the cover member 12 was mounted in the center thereof.

Comparative Example 1 and Comparative Example 2

Organic semiconductor films were formed and organic semiconductor elements were produced in the same manner as in Working Example 1 with the exception that the length in the x-direction of the Teflon sheet serving as the cover member 12 was set to 1 mm (Comparative Example 1) and with the exception that the height of the arc of the cover member 12 was set to 7 mm (Comparative Example 2), respectively.

Comparative Example 3

An organic semiconductor element was produced in the same manner as in Working Example 1 with the exception that an organic semiconductor film of the same size as the organic semiconductor film formed in Working Example 1 was formed by dropping the coating solution onto the substrate 10 with a syringe without using a cover member.

Comparative Example 4

The Teflon sheet was not bent, and the entire area of one end was brought into contact with the substrate 10 in a flat state and erected on the substrate 10 at an angle of 7.2°.

An organic semiconductor film was formed and an organic semiconductor element was produced in the same manner as in Working Example 1 with the exception that the end part side where the Teflon sheet and the substrate 10 make contact was filled with the coating solution E so that the length Ly in the y-direction was 8 mm.

The length Ly in the y-direction and the length Lx in the x-direction of the coating solution E, the apparent angle θ [°], the surface area [mm$^2$] of the coating solution E, the contact area [mm$^2$] with the outside air and the percentage [%] of the area in contact with the outside air, and the ratio x/y in the state in which the space 16 was filled with the coating solution E in each example of the Working Examples 2 to 9 and the Comparative Examples 1, 2, and 4 are shown in table below.

<Mobility Measurement>

Each electrode of each organic semiconductor element produced in this way was connected to each terminal of a manual prober connected to a 4155C produced by Agilent Technologies, and field effect transistor (FET) evaluations were performed. Specifically, the field effect mobility ([cm$^2$/V·sec]) was calculated by measuring the characteristic of the drain current-gate voltage (Id–Vg).

The results were $1\times10^{-1}$ in Working Example 1, $1.5\times10^{-1}$ in Working Example 2, $8\times10^{-2}$ in Working Example 3, $5\times10^{-2}$ in Working Example 4, $1.5\times10^{-1}$ in Working Example 5, $7\times10^{-2}$ in Working Example 6, $4\times10^{-2}$ in Working Example 7, $1.5\times10^{-1}$ in Working Example 8, and $2\times10^{-1}$ in Working Example 9.

In addition, the results were $5\times10^{-3}$ in Comparative Example 1, $5\times10^{-3}$ in Comparative Example 2, $1\times10^{-3}$ in Comparative Example 3, and $5\times10^{-3}$ in Comparative Example 4.

The results are listed together in the table below.

TABLE 1

| | Working Example | | | | | | | | | Comparative Example | | | |
|---|---|---|---|---|---|---|---|---|---|---|---|---|---|
| | 1 | 2 | 3 | 4 | 5 | 6 | 7 | 8 | 9 | 1 | 2 | 3 | 4 |
| Coating solution length Ly [mm] | 8 | 8 | 8 | 8 | 16 | 8 | 8 | 8 | 8 | 8 | 8 | Syringe dropping | 8 |
| Coating solution length Lx [mm] | 16 | 16 | 8 | 4 | 16 | 16 | 16 | 64 | 160 | 1 | 16 | | 16 |
| Uppermost part height [mm] | 1 | 1.6 | 1 | 1 | 1 | 2.5 | 5 | 1 | 1 | 1 | 7 | | 1 |
| Apparent angle θ [°] | 7.2 | 11.5 | 7.2 | 7.2 | 3.6 | 18.2 | 38.7 | 7.2 | 7.2 | 7.2 | 61 | | 7.2 |
| Coating solution surface area [mm$^2$] | 281 | 297 | 144 | 76 | 544 | 322 | 399 | 1100 | 2738 | 25 | 466 | | 281 |
| Side surfaces (2 surfaces) [mm$^2$] | 8 | 13 | 8 | 8 | 16 | 20 | 40 | 8 | 8 | 8 | 56 | | 8 |
| End surface on opposite side of base end [mm$^2$] | 16 | 26 | 8 | 4 | 16 | 40 | 80 | 64 | 160 | 1 | 112 | | 16 |
| Substrate contact surface [mm$^2$] | 128 | 128 | 64 | 32 | 256 | 128 | 128 | 512 | 1280 | 8 | 128 | | 128 |
| Cover contact surface [mm$^2$] | 129 | 131 | 64 | 32 | 256 | 134 | 151 | 516 | 1290 | 8 | 170 | | 129 |
| Outside air contact area [mm$^2$] | 24 | 39 | 16 | 12 | 32 | 60 | 120 | 72 | 168 | 9 | 168 | | 24 |
| Outside air contact surface percentage [%] | 9 | 13 | 11 | 16 | 6 | 19 | 30 | 7 | 6 | 36 | 36 | | 9 |
| x/y ratio | 2 | 2 | 1 | 0.5 | 1 | 2 | 2 | 8 | 20 | 0.12 | 2 | | 2 |
| Mobility [cm$^2$/V·sec] | 1E−01 | 1.5E−01 | 8E−02 | 5E−02 | 1.5E−01 | 7E−02 | 4E−02 | 1.5E−01 | 2E−01 | 5E−03 | 5E−03 | 1E−03 | 5E−03 |

As shown in the table above, the semiconductor elements (TFTs) produced with the production method of the present invention all have good mobility since organic semiconductor elements can be formed while properly controlling the drying of the coating solution E.

In contrast, in Comparative Example 1 in which the ratio x/y of the coating solution is too small, Comparative Example 2 in which the apparent angle of the coating solution E is too large, and Comparative Example 3 in which an organic semiconductor film was formed without using a cover member, the drying of the coating solution E cannot be controlled, and high mobility is not achieved. Further, in Comparative Example 4, which does not have a descending part which descends from the uppermost part toward the opposite side of the base end, the solvent that evaporates from the coating solution is discharged to the outside of the cover member, and the solvent concentration inside the cover member cannot be made high. Therefore, the drying of the coating solution E similarly cannot be controlled, and high mobility is not achieved.

The effect of the present invention is clear from the above results.

What is claimed is:

1. A method for forming an organic semiconductor film in which, when a solution in which an organic semiconductor material is dissolved is used so as to form an organic semiconductor film including the organic semiconductor material;

the organic semiconductor film is formed by using a cover member which is disposed on a substrate for forming the organic semiconductor film and forms a space relative to the substrate, filling the space between the cover member and the substrate with the solution, and drying the filled solution;

wherein the cover member has a control surface on which an uppermost part most separated from the substrate and a descending part provided on both sides in the y-direction of the uppermost part so as to descend from the uppermost part toward the substrate are formed; the cover member has a shape that opens in the x-direction orthogonal to the y-direction of the space where the control surface is formed; and the cover member is disposed in a state in which the entire area of at least one end part in the y-direction makes contact with the substrate with the control surface facing the substrate;

when an end part in the y-direction where the entire area of the cover member makes contact with the substrate is used as a base end, at least a part of the solution at the end part in the y-direction on the opposite side from the base end on the control surface is positioned at a location not surpassing the uppermost part of the control surface when viewed from the base end; and an apparent angle, which is an angle formed by (i) the shortest line connecting the base end and a separation position serving as a position where the solution is most separated from the base end in the y-direction on the control surface and (ii) the shortest line connecting the base end and a point where a perpendicular line dropped from the separation position onto the substrate intersects with the substrate, is at most 50°; and the base end side of the space between the cover member and the substrate is filled with the solution so that a ratio x/y determined by dividing the length in the x-direction by the length in the y-direction is at least 0.2.

2. The method for forming an organic semiconductor film according to claim 1, wherein the surface area of a portion where the solution does not make contact with the substrate and the cover member is at most 35% of the surface area of the entire solution.

3. The method for forming an organic semiconductor film according to claim 1, wherein the surface area of a portion where the solution does not make contact with the substrate and the cover member is at least 1% of the surface area of the entire solution.

4. The method for forming an organic semiconductor film according to claim 1, wherein the apparent angle is at least 3°.

5. The method for forming an organic semiconductor film according to claim 1, wherein the ratio x/y is at most 100,000.

6. The method for forming an organic semiconductor film according to claim 1, wherein the cover member is disposed so that both end parts in the y-direction make contact with the substrate.

7. The method for forming an organic semiconductor film according to claim 6, wherein the cover member is disposed so that the entire area of both end parts in the y-direction makes contact with the substrate.

8. The method for forming an organic semiconductor film according to claim 1, wherein the cover member has a tabular shape.

9. The method for forming an organic semiconductor film according to claim 1, wherein the cover member has an area parallel to both end parts in the y-direction.

* * * * *